(12) United States Patent
Takayanagi

(10) Patent No.: US 8,112,196 B2
(45) Date of Patent: Feb. 7, 2012

(54) ELECTRONIC CONTROL UNIT AND VEHICLE BEHAVIOR CONTROL DEVICE

(75) Inventor: Akihide Takayanagi, Nagano (JP)

(73) Assignee: Nissin Kogyo Co., Ltd., Nagano (JP)

( * ) Notice: Subject to any disclaimer, the term of this patent is extended or adjusted under 35 U.S.C. 154(b) by 827 days.

(21) Appl. No.: 12/178,814

(22) Filed: Jul. 24, 2008

(65) Prior Publication Data
US 2009/0030571 A1    Jan. 29, 2009

(30) Foreign Application Priority Data

Jul. 26, 2007   (JP) ................................. 2007-194578

(51) Int. Cl.
*B60R 16/02*       (2006.01)
*B60T 8/34*        (2006.01)
(52) U.S. Cl. ............ 701/36; 361/796; 361/752; 439/74; 439/75; 439/76.1; 73/493
(58) Field of Classification Search .................. 701/36; 303/119.3; 361/796, 752, 622; 439/74, 75, 439/76.1, 76.2; 73/493; *B60R 16/02; B60T 8/34*
See application file for complete search history.

(56) References Cited

U.S. PATENT DOCUMENTS

| 4,858,071 A * | 8/1989 | Manabe et al. ............... 361/720 |
| 5,022,717 A | 6/1991 | Heibel et al. |
| 5,040,853 A | 8/1991 | Burgdorf et al. |
| 5,657,203 A * | 8/1997 | Hirao et al. .................... 361/707 |
| 6,164,732 A | 12/2000 | Tominaga et al. |
| 7,147,486 B2 * | 12/2006 | Clark .......................... 439/76.1 |
| 2004/0102888 A1 | 5/2004 | Burgdorf et al. |
| 2004/0227481 A1 | 11/2004 | Hayashi |

FOREIGN PATENT DOCUMENTS

| CN | 1631639 | 6/2005 |
| DE | 4340280 | 3/1995 |
| EP | 0373551 | 12/1989 |
| EP | 1477386 | 11/2004 |

(Continued)

OTHER PUBLICATIONS

Chinese Office Action for corresponding Chinese Application No. 200810168653.5 dated Oct. 25, 2010 (English translation attached).

(Continued)

*Primary Examiner* — Eric Culbreth
*Assistant Examiner* — Keith Frisby
(74) *Attorney, Agent, or Firm* — Andrew M. Calderon; Roberts Mlotkowski Safran & Cole. P.C.

(57) ABSTRACT

An electronic control unit includes a sensor circuit board 30 which is mounted with sensors 33, 34 for detecting a predetermined physical quantity; a control circuit board 20 which controls an operation of an electric component on the basis of the physical quantity detected by the sensors 33, 34; and a housing 40 which accommodates the sensor circuit board 30 and the control circuit board 20, wherein at least one of the sensor circuit board 30 and the control circuit board 20 is mounted to a circuit board support stepped portion 47 formed in an inner surface of the housing 40 so that the sensor circuit board 30 and the control circuit board 20 are arranged in a layered state.

20 Claims, 13 Drawing Sheets

FOREIGN PATENT DOCUMENTS

| | | |
|---|---|---|
| EP | 1557335 | 1/2005 |
| JP | 09-159689 | 6/1997 |
| JP | 2000159083 | 6/2000 |
| JP | 2001-347939 | 12/2001 |
| JP | 2004-506572 | 3/2004 |
| JP | 2004-336975 | 11/2004 |
| JP | 2005-200013 | 7/2005 |
| WO | WO8910286 | 11/1989 |

OTHER PUBLICATIONS

Extended European Search Report for corresponding European Application No. 08013346.5 dated Sep. 30, 2010.

English translation of Office Action for Corresponding Japanese Application No. JP2007-194578.

* cited by examiner

ELECTRONIC CONTROL UNIT AND VEHICLE BEHAVIOR CONTROL DEVICE

BACKGROUND OF INVENTION

1. Field of the Invention

The present invention relates to an electronic control unit for controlling an operation of an electric component and a vehicle behavior control device using the electronic control unit.

2. Description of the Related Art

A vehicle behavior control device for stabilizing a behavior of a vehicle such as an automobile includes electric components such as an electromagnetic valve, a pressure sensor, and a motor; a reciprocating pump which is operated by a power generated by the motor; a reservoir component which constitutes a reservoir; an electronic control unit which controls an operation of the motor or the electromagnetic valve; a sensor which detects a behavior of a vehicle body; and a base body in which a brake hydraulic passage is formed and the various components are assembled.

The electronic control unit includes a control circuit board which controls an operation of the electromagnetic valve or the motor on the basis of the behavior of the vehicle body detected by the sensor and a housing which accommodates the control circuit board.

Then, in the above-described vehicle behavior control device, the electronic control unit controls an operation of the electromagnetic valve or the motor on the basis of the behavior of the vehicle body detected by the sensor so that a brake hydraulic pressure in the brake hydraulic passage changes to control a brake force of a vehicle-wheel brake and to thus stabilize the behavior of the vehicle.

In the vehicle behavior control device with the above-described configuration, when the sensor is disposed on a vehicle-room side and the electronic control unit is disposed in an engine room, the number of components such as a harness for connecting the sensor to the electronic control unit increases, and a separate space needs to be provided so as to accommodate the sensor and the electronic control unit.

Therefore, there is a known technique in which the sensor is provided in a surface of the control circuit board and the sensor is provided in the electronic control unit, for example, JP-B-3201242 in paragraph '0015', FIG. 2.

In the electronic control unit, since it is not necessary to connect the sensor to the control circuit board by a member such as a harness, it is possible to decrease the number of components. Additionally, since it is not necessary to separately provide the sensor and the electronic control unit in the vehicle, it is possible to realize a decrease in size and weight of the vehicle.

However, when the sensors such as the angular speed sensor and the acceleration sensor for detecting the behavior of the vehicle body are mounted to a surface of the control circuit board, since it is necessary to ensure a space for mounting the sensors to the surface of the control circuit board, a problem arises in that an area of the control circuit board becomes large.

When an examination/adjustment operation of the sensor is carried out, since a whole area of the control circuit board is a process target, a problem arises in that process efficiency during the examination/adjustment operation of the sensor decreases.

When the specification of the sensor needs to be changed, since it is necessary to largely change the configuration of the control circuit board, a problem arises in that a cost and an operation time increase in accordance with a specification change of the sensor.

SUMMARY OF INVENTION

In one or more embodiments of the invention, a vehicle behavior control device using an electronic control unit is provided with a process efficiency during an examination/adjustment operation of a sensor without increasing an area of a control circuit board and of reducing a cost and an operation time spent for a specification change of the sensor.

According to a first aspect of the invention, an electronic control unit is provided with a sensor circuit board which is mounted on a sensor for detecting a physical quantity, a control circuit board which controls an operation of an electric component on a basis of the detected physical quantity; and a housing which accommodates the sensor circuit board and the control circuit board, wherein the sensor circuit board is mounted to a stepped portion formed in an inner surface of the housing so that the sensor circuit board and the control circuit board are arranged in a layered state, and the sensor circuit board is electrically connected to the control circuit board by a conductive member embedded in the housing.

According to a second aspect of the invention, wherein the conductive member includes a connection terminal exposed on a surface of the stepped portion, and the sensor circuit board is electrically connected to the connection terminal by a bonding wire.

According to a third aspect of the invention, wherein the conductive member comprises a press-fitting terminal exposed on a surface of the stepped portion, and the press-fitting terminal is press-fitted to a connection hole formed in the sensor circuit board so that the sensor circuit board is electrically connected to the press-fitting terminal.

According to a fourth aspect of the invention, wherein an engagement portion is formed in the inner surface of the housing to insert the sensor circuit board.

According to a fifth aspect of the invention, wherein a layered portion is formed on a surface of the control circuit board so as to layer the sensor circuit board above the control circuit board, and a tallest electronic component among a plurality of the electronic components mounted to the surface of the control circuit board is mounted to a portion other than the layered portion.

According to a sixth aspect of the invention, wherein the sensor comprises an angular speed sensor and an acceleration sensor.

According to a seventh aspect of the invention, a vehicle behavior control device using the electronic control unit is provided with a base body which has a brake hydraulic passage, and an electric component which is provided in the base body, wherein the electronic control unit controls an operation of the electromagnetic component on the basis of the behavior of a vehicle body detected by the sensor so as to control a brake hydraulic pressure in the brake hydraulic passage.

According to an eighth aspect of the invention, wherein the conductive member includes a connection terminal exposed on a surface the stepped portion, and the sensor circuit board is electrically connected to the connection terminal by a bonding wire.

According to a ninth aspect of the invention, wherein the conductive member includes a press-fitting terminal exposed on a surface of the stepped portion, and the press-fitting terminal is press-fitted to a connection hole formed in the control circuit board so that the control circuit board is electrically connected to the press-fitting terminal.

According to a tenth aspect of the invention, wherein the layered portion has a space between the control circuit board and the sensor circuit board, and upper surfaces both of the circuit board and the sensor circuit board are mounted to electric component.

According to the first aspect of the invention, since the sensor circuit board and the control circuit board are accommodated in the housing in a layered state, and the sensor is not necessary to be provided in the surface of the control circuit board, it is not necessary to allow the control circuit board to have a large area.

Since the sensor circuit board and the control circuit board are separated from each other, and only the sensor circuit board is a process target upon carrying out the examination/adjustment operation of the sensor, it is possible to improve process efficiency of the examination/adjustment operation of the sensor.

Since only the configuration of the sensor circuit board is changed without changing the configuration of the control circuit board upon changing the specification of the sensor, it is possible to reduce a cost and an operation time spent for the specification change of the sensor.

Since the sensor circuit board and the control circuit board are arranged in a layered state by mounting at least one of the sensor circuit board and the control circuit board to the stepped portion formed in the inner surface of the housing so that the sensor circuit board is electrically connected to the control circuit board by the conductive member embedded in the housing, it is not necessary to provide components such as a harness for connecting the sensor circuit board to the control circuit board in an inner space of the housing, thereby efficiently using the inner space of the housing.

According to the second aspect of the invention, since the sensor circuit board can be electrically connected to the control circuit board in such a manner that the connection terminal of the conductive member exposed on the surface of the stepped portion is connected the sensor circuit board or the control circuit board mounted to the stepped portion by a bonding wire, it is possible to improve assembling efficiency of the sensor circuit board and the control circuit board.

According to the third aspect of the invention, since the sensor circuit board can be electrically connected to the control circuit board in such a manner that the press-fitting terminal formed in the surface of the stepped portion is press-fitted to the connection hole of the sensor circuit board or the control circuit board mounted to the stepped portion.

According to the fourth aspect of the invention, it is possible to position the sensor circuit board to the housing by engaging the sensor circuit board with the engagement portion of the housing. Accordingly, since a detection shaft of the sensor can be simply identical with a reference shaft set in the housing, it is possible to improve assembling efficiency of the sensor circuit board and the control circuit board.

According to the fifth aspect of the invention, since a gap between the sensor circuit board and the control circuit board becomes narrower in such a manner that the tallest electronic component among a plurality of electronic components and an electronic component having a similar height to that of the tallest electronic component are mounted to a portion other than the layered portion, and a comparatively short electronic component among the plurality of electronic components is mounted to the layered portion, it is possible to realize a decrease in size of the electronic control unit.

Since it is possible to suppress a gab between the sensor circuit board and the control circuit board even when the sensor or electronic component are mounted to both surfaces of the sensor circuit board because of the fact that a surface of the sensor circuit board opposed to the control circuit board is opposed to the layered portion mounted with a comparatively short electronic component, it is possible to efficiently use the inner space of the housing. Additionally, since the number of components mounted to the respective surfaces of the sensor circuit board decreases, it is possible to reduce an area of the sensor circuit board and thus to realize a decrease in size of the sensor circuit board.

According to the sixth aspect of the invention, it is possible to realize a decrease in size of the electronic control unit provided with the angular speed sensor or the acceleration sensor used to detect the behavior of the vehicle body, and to improve process efficiency during the examination/adjustment operation of the sensor. Also, it is possible to reduce a cost spent for the specification change of the sensor.

According to the seventh aspect of the invention, since the sensor is provided in the electronic control unit, it is possible to simply carry out an assembling operation without a harness upon assembling the vehicle behavior control device to the vehicle. Since it is not necessary to allow the control circuit board to have a large area, it is possible to prevent an unnecessary increase in size of the vehicle behavior control device.

Since it is possible to improve process efficiency during the examination/adjustment operation of the sensor, to reduce a cost and an operation time spent for the specification change of the sensor, and to improve assembling efficiency of the sensor circuit board and the control circuit board, it is possible to reduce a manufacture cost of the vehicle behavior control device.

With the electronic control unit according to the invention, since it is not necessary to provide the sensor on the surface of the control circuit board, it is not necessary to make the area of the control circuit board large.

Since only the sensor circuit board is the process target during the examination/adjustment operation of the sensor, it is possible to improve process efficiency.

Since it is not necessary to change a configuration of the control circuit board upon changing the specification of the sensor, it is possible to reduce the cost and the operation time spent for a specification change of the sensor.

Since one of the sensor circuit board and the control circuit board is mounted to the stepped portion formed in the inner surface of the housing so that the sensor circuit board and the control circuit board are arranged in a layered state, and the sensor circuit board is electrically connected to the control circuit board by a conductive member embedded in the housing, it is not necessary to provide a component such as a harness for connecting the sensor circuit board to the control circuit board in an inner space of the housing, thereby efficiently using the inner space of the housing.

In the vehicle behavior control device using the above-described electronic control unit, since the sensor is provided in the electronic control unit, it is possible to simply carry out an assembling operation without a harness upon assembling the vehicle behavior control device to the vehicle. Since it is not necessary to allow the control circuit board to have a large area, it is possible to prevent an unnecessary increase in size of the vehicle behavior control device.

Since it is possible to improve process efficiency during the examination/adjustment operation of the sensor, to reduce a cost and an operation time spent for the specification change of the sensor, and to improve assembling efficiency of the sensor circuit board and the control circuit board, it is possible to reduce a manufacture cost of the vehicle behavior control device.

Other aspects and advantages of the invention will be apparent from the following description and the appended claims.

DESCRIPTION OF EXEMPLARY EMBODIMENTS

In this embodiment, an electronic control unit applies to a vehicle behavior control device for stabilizing a behavior of a vehicle by controlling a brake force of a vehicle-wheel brake.

[Configuration of Vehicle Behavior Control Device]

First, a configuration of a vehicle behavior control device U will be described with reference to FIG. 1.

The vehicle behavior control device U mainly includes a base body 100 which is mounted with electric components (e.g., electromagnetic components) such as an electromagnetic valve V, a pressure sensor S, a motor 200 or a reciprocating pump P and an electronic control unit 10 which controls an opening/closing operation of the electromagnetic valve V and an operation of the motor 200 by detecting a behavior of a vehicle. A brake hydraulic passage is formed in the base body 100. The electronic control unit 10 operates the electromagnetic valve V or the motor 200 on the basis of a behavior of a vehicle body so as to change a brake hydraulic pressure in the brake hydraulic passage.

(Configuration of Base Body)

Figure 1:
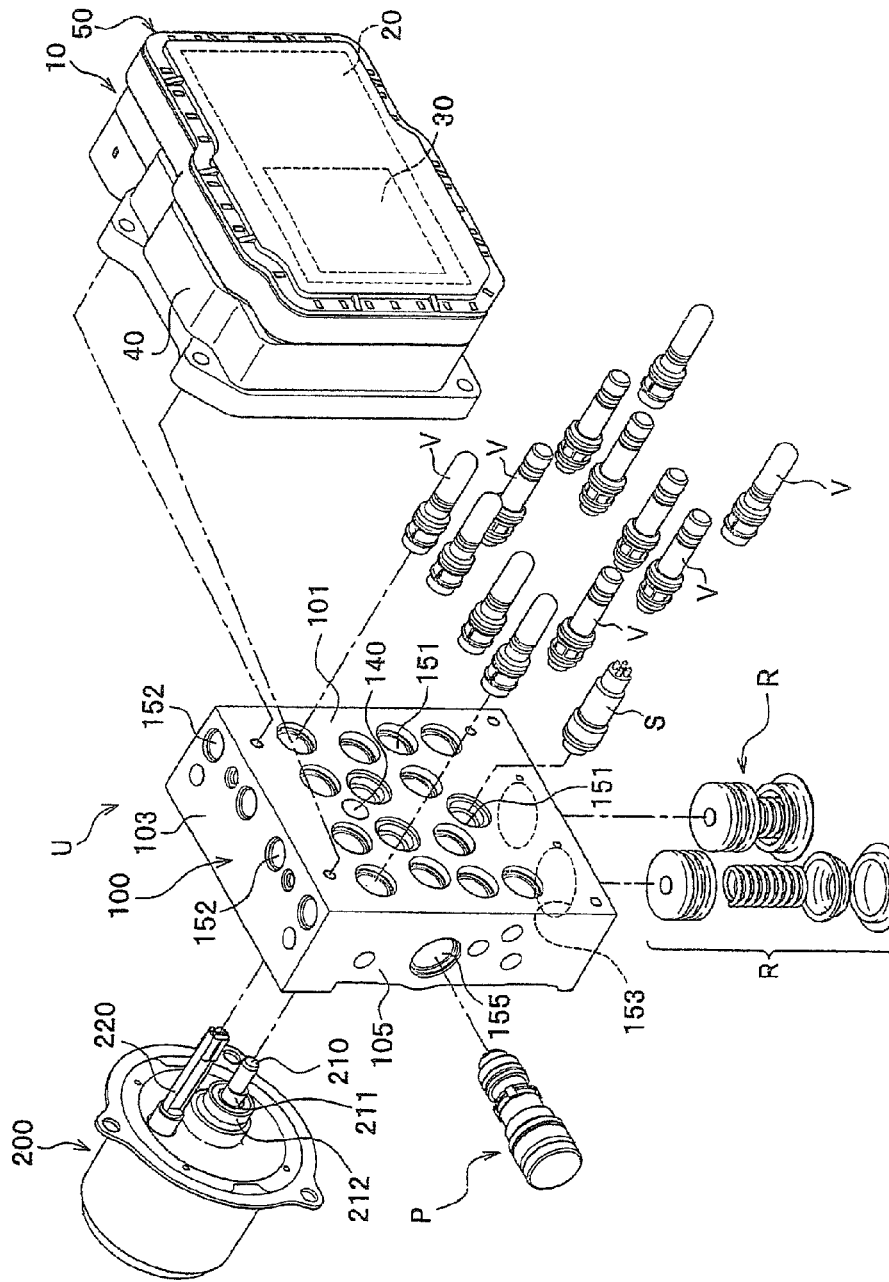
FIG. 1 is an exploded perspective view showing a vehicle behavior control device having an electronic control unit according to an embodiment.

As shown in FIG. 1, the base body 100 is a metallic component substantially formed into a rectangular parallelepiped, and the brake hydraulic passage (passage) is formed therein.

A plurality of mounting holes 151 having a bottom are formed in a front surface 101 among the respective surfaces of the base body 100 so that the electric components such as the electromagnetic valve V or the pressure sensor S are mounted thereto.

Four outlet ports 152 are formed in an upper surface 103 of the base body 100 so as to be respectively connected to pipes extending to the vehicle-wheel brake (not shown).

Two reservoir holes 153 are formed in a lower surface of the base body 100 so that reservoir components R constituting a reservoir are mounted thereto.

A pump hole 155 is formed in a side surface 105 of the base body 100 so that the reciprocating pump P is mounted thereto.

Additionally, the holes provided in the base body 100 communicate with one another directly or via the brake hydraulic passage (not shown) formed in the base body 100.

(Configuration of Motor)

Figure 2:
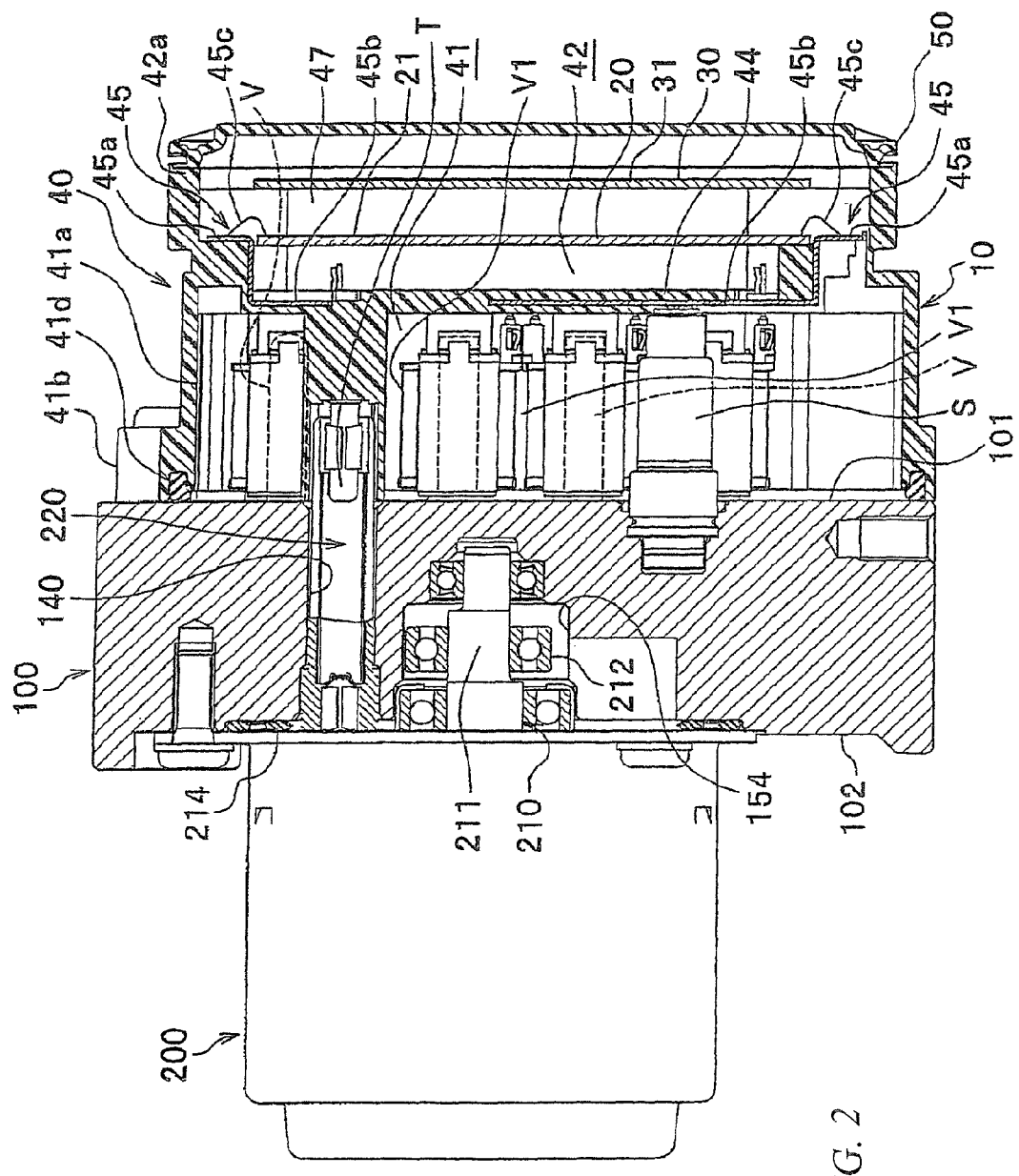
FIG. 2 is a side sectional view showing the vehicle behavior control device having the electronic control unit according to the embodiment.

As shown in FIG. 2, the motor 200 is an electric component used as a power source for the reciprocating pump P, and is integrally fixed to a rear surface 102 of the base body 100. Additionally, a ring seal member 214 is formed between the motor 200 and the rear surface 102 of the base body 100 so as to fluid-tightly seal a gap between the motor 200 and the rear surface 102 of the base body 100.

An eccentric shaft portion 211 is provided in an output shaft 210 of the motor 200, and a ball bearing 212 is fitted to the eccentric shaft portion 211. The eccentric shaft portion 211 and the ball bearing 212 are inserted into a motor mounting hole 154. A motor bus bar 220 is connected to a portion above the output shaft 210 so as to supply an electric power to a rotor (not shown). The motor bus bar 220 is inserted through a terminal hole 140, and is connected to a control circuit board 20 via a terminal T provided in the electronic control unit 10.

[Configuration of Electronic Control Unit]

As shown in FIG. 1, the electronic control unit 10 includes a housing 40 which accommodates the control circuit board 20, a sensor circuit board 30 or the electric components protruding from the base body 100 and a cover 50 which blocks an opening portion of the housing 40.

(Configuration of Housing)

As shown in FIG. 2, the housing 40 is a box body which is made from synthetic resin and is integrally fixed to the front surface 101 of the base body 100 while covering the electric components such as the electromagnetic valve V or the pressure sensor S protruding from the front surface 101 of the base body 100.

In the housing 40, a front surface (a right surface of FIG. 2) and a rear surface (a left surface of FIG. 2) are opened. A first accommodation chamber 41 is formed in an inner space so as to accommodate the electric components such as the electromagnetic valve V, the electronic coil V1, and the pressure sensor S. A second accommodation chamber 42 is formed in a front side of the inner space so as to accommodate the sensor circuit board 30 or the control circuit board 20.

The housing 40 includes;

a first peripheral wall portion 41a which forms the first accommodation chamber 41:

a connector connection portion 43 (see FIG. 3A) which is disposed on a side of the first peripheral wall portion 41a:

a second peripheral wall portion 42a which forms the second accommodation chamber 42: and a partition portion 44 (see FIG. 3A) which defines the first accommodation chamber 41 and the second accommodation chamber 42.

The first peripheral wall portion 41a is a part which surrounds the electric components, and includes a flange 41b which comes into contact with an outer periphery of the front surface 101 of the base body 100. A mounting hole 41c is formed in an appropriate position of the flange 41b (see FIG. 3A).

Additionally, a ring seal member 41d is mounted to an end surface of the flange 41b on the side of the base body 100 along an inner periphery of the flange 41b. The seal member 41d is a member which seals a gap between the base body 100 and the housing 40 while being in close contact with the front surface 101 of the base body 100.

Figure 3A:
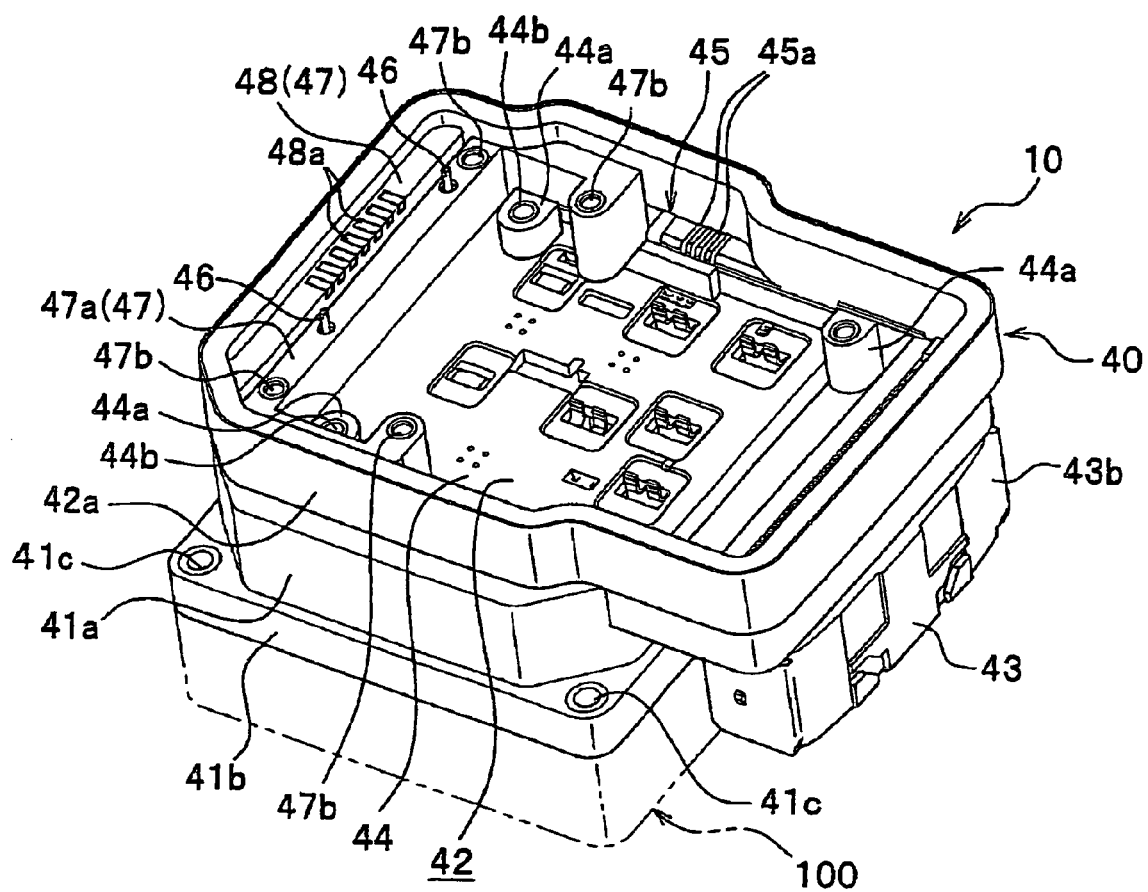
FIG. 3A is a perspective view when viewed from a front side of a housing before a sensor circuit board and a control circuit board are mounted to the housing.

The second peripheral wall portion 42a is a part which surrounds the sensor circuit board 30 and the control circuit board 20, and is disposed on the front side of the first peripheral wall portion 41a and the connector connection portion 43 (see FIG. 3A).

Figure 3B:
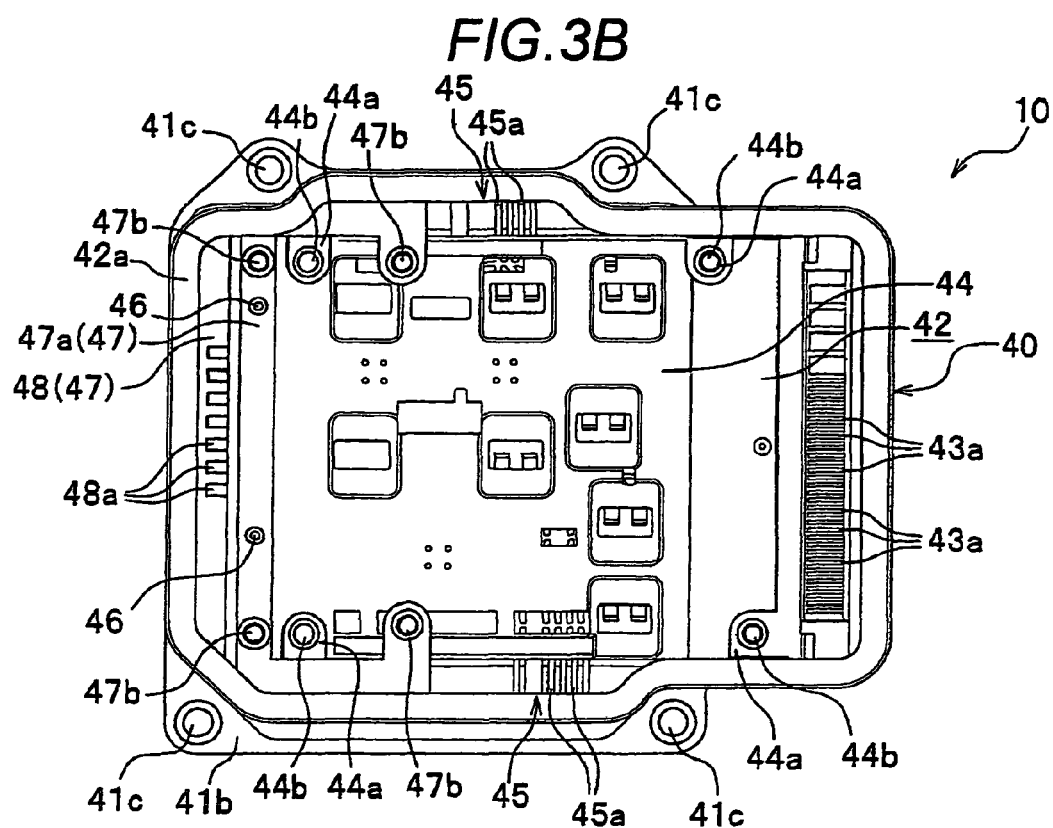
FIG. 3B is a top view showing the housing when viewed from the front side of the housing before the sensor circuit board and the control circuit board are mounted to the housing.

As shown in FIG. 3B, an outer peripheral shape of the second peripheral wall portion 42a is substantially formed into a rectangular shape, and an outward swollen part is formed in two elongate sides (two upper and lower sides of FIG. 3B). A first terminal collection portion 45 is formed on the inner side of the part in which the second peripheral wall portion 42a is swollen.

In the first terminal collection portion 45, front surfaces (a surface on the side of the second accommodation chamber 42) of a plurality of terminals 45a corresponding to metallic components are exposed on the outer peripheral side of the control circuit board 20. As shown in FIG. 2, conductive members 45b extending from the predetermined terminals 45a are embedded in the partition wall portion 44 and are electrically connected to a terminal of the electronic coil V1, a terminal of the pressure sensor S, and the motor bus bar 220 of the motor 200, respectively, at a position on the rear surface side of the partition portion 44 (on the side of the first accommodation chamber 41).

The connector connection portion 43 shown in FIG. 3A is a part connected to a connector provided in an end portion of an external wiring cable (not shown), and includes a plurality of connection terminals 43a (see FIG. 3B) which extend from the second accommodation chamber 42 to an outer surface (a surface exposed to the outside) via a bottom wall of the connector connection portion 43 and a side wall 43b which surrounds the connection terminals 43a.

As shown in FIG. 3B, the partition portion 44 is substantially formed in an elongate direction, and each of circuit board support portions 44a protrudes at four corners on a surface on the side of the second accommodation chamber 42. Additionally, as shown in FIG. 3B, the circuit board support portion 44a on the right and lower side extends along a side portion of the partition portion 44. The protruding end surface of the circuit board support portion 44a comes into contact with the rear surface of the control circuit board 20. A mounting hole 44b is formed in the protruding end surfaces of the circuit board support portions 44a located at the four corners of the partition portion 44, and a screw groove is formed in the inner peripheral surface of the mounting hole 44b.

A circuit board support stepped portion 47 is formed at a left portion of FIG. 3B in a surface of the partition portion 44 on the side of the second accommodation chamber 42. The circuit board support stepped portion 47 is formed along the inner peripheral surface of the second peripheral wall portion 42a, and is provided with a support portion 47a for supporting the sensor circuit board 30 (see FIG. 5A) at a predetermined height and a second terminal collection portion 48. Specifically, as shown in FIG. 3B, the second terminal collection portion 48 is formed in a linear shape along the inner surface on the left side of the second peripheral wall portion 42a, and the support portion 47a is formed on the right side of the second terminal collection portion 48.

The support portion 47a is provided with a linear part which is formed along the second terminal collection portion 48 and a part which protrudes inward from the upper and lower inner surface of the second peripheral wall portion 42a shown in FIG. 3B. A concave groove is formed between the linear part of the support portion 47a and the second terminal collection portion 48.

The protruding end surface of the support portion 47a is a part which comes into contact with the rear surface of the sensor circuit board 30. The protruding end surface of the support portion 47a is more located at a front side (an upper side of FIG. 3A) than the protruding end surface of the circuit board support portion 44a, and is more located at a rear side (a lower side of FIG. 3A) than the protruding end surface of the second terminal collection portion 48 by a thickness of the sensor circuit board 30. Accordingly, when the sensor circuit board 30 is mounted to the protruding end surface of the support portion 47a, a height (position) of the protruding end surface of the second terminal collection portion 48 is identical with that of the front surface of the sensor circuit board 30.

Four mounting holes 47b are formed in the protruding end surface of the support portion 47a. Two mounting holes 47b are formed in a part along the second terminal collection portion 48, and as shown in FIG. 3B, the other two mounting holes 47b are formed in a part which protrudes from the upper and lower inner surface of the second peripheral wall portion 42a. Then, when the sensor circuit board 30 (see FIG. 5B) is mounted to the protruding end surface of the support portion 47a, the mounting holes 47b respectively communicate with insertion holes 32a formed at four corners of the sensor circuit board 30. A screw groove is formed in an inner peripheral surface of each mounting hole 47b.

Among the mounting holes 47b of the support portion 47a, two reference pins 46, 46 protrude from a part along the second terminal collection portion 48 between the mounting holes 47b, 47b at a predetermined interval therebetween in a vertical direction shown in FIG. 3B. Additionally, 'the reference pin' in this embodiment corresponds to 'the engagement portion' in Claims, and is a protrusion having a circular shape in a sectional view in this embodiment.

Figure 5A:
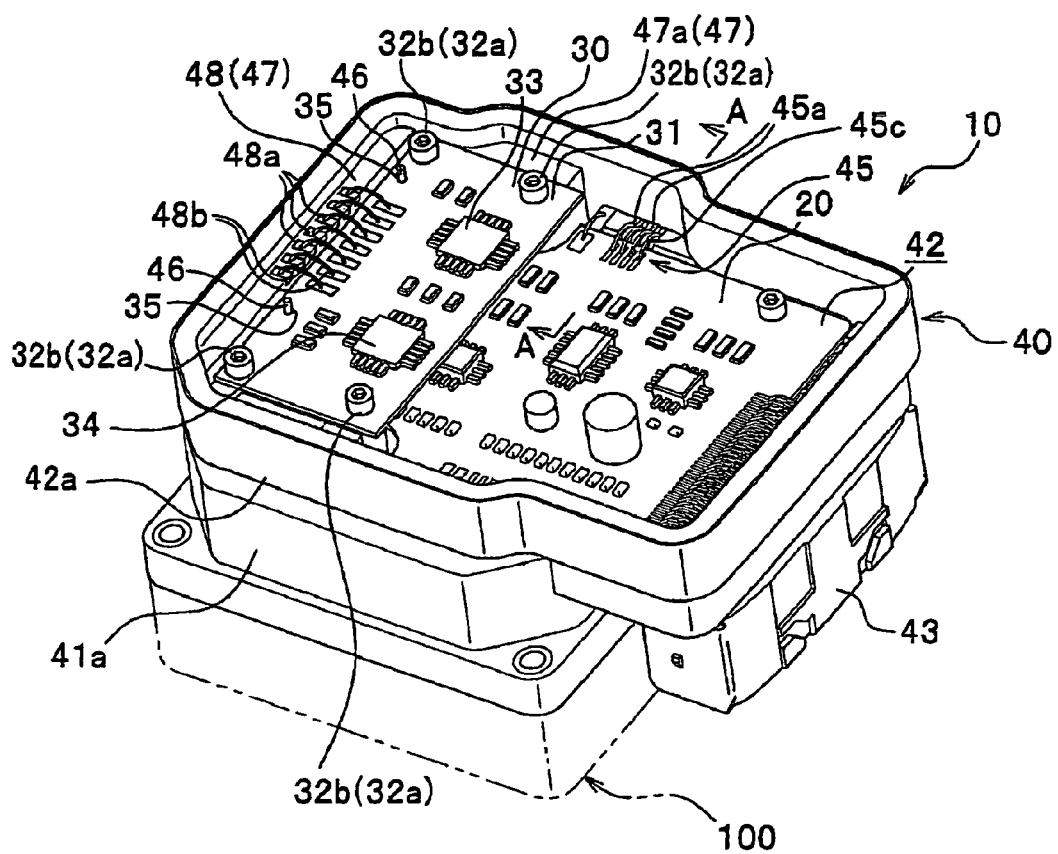
FIG. 5A is a perspective view when viewed from a front side of the housing in a state in which the sensor circuit board and the control circuit board are mounted to the housing.
Figure 5B:
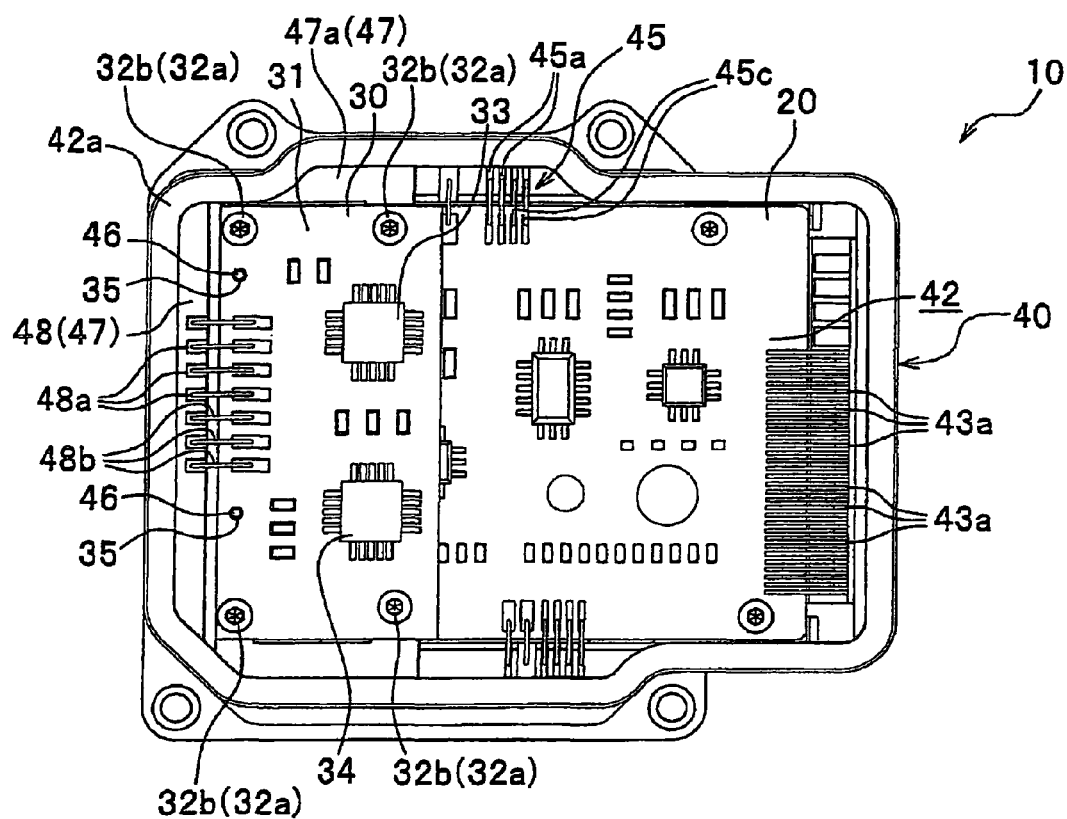
FIG. 5B is a top view when viewed from the front side of the housing in the state in which the sensor circuit board and the control circuit board are mounted to the housing.

In the second terminal collection portion 48, front surfaces (surfaces on the side of the second accommodation chamber 42) of a plurality of terminals 48a corresponding to metallic components are exposed on the outer peripheral side of the sensor circuit board 30 (see FIG. 5B). Additionally, the terminal of the second terminal collection portion in this embodiment corresponds to the connection terminal.

Figure 6A:
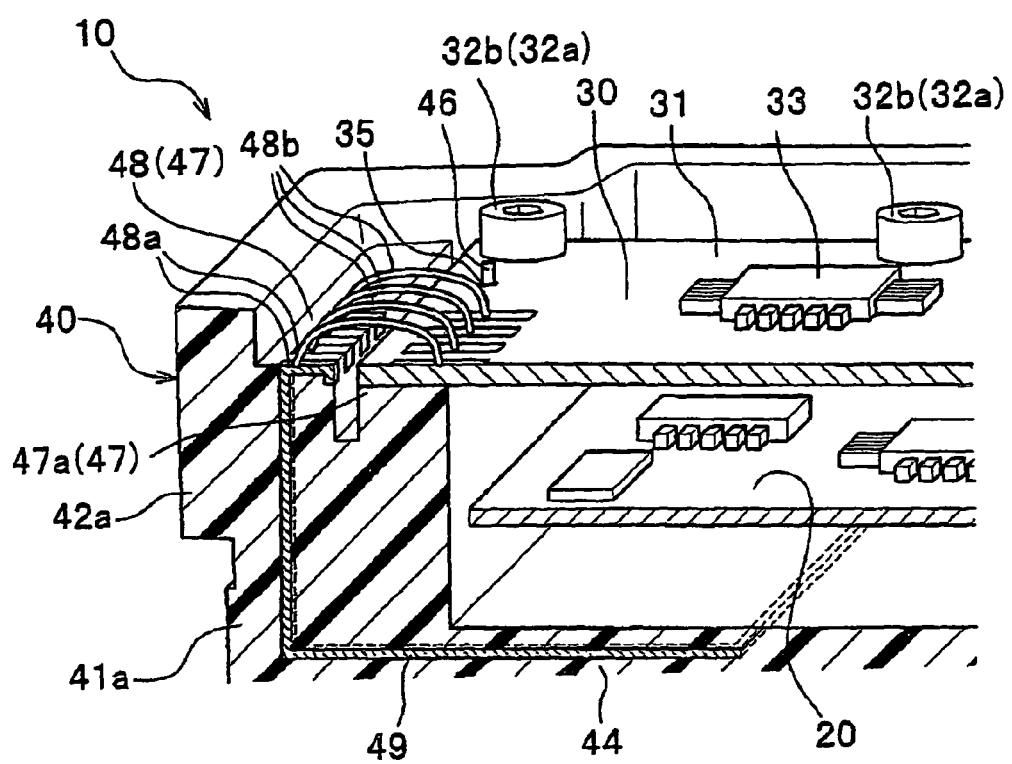
FIG. 6A is a sectional view showing a connection state between the conductive member and a second terminal collection portion in state in which a conductive member is disposed in the housing.
Figure 6B:
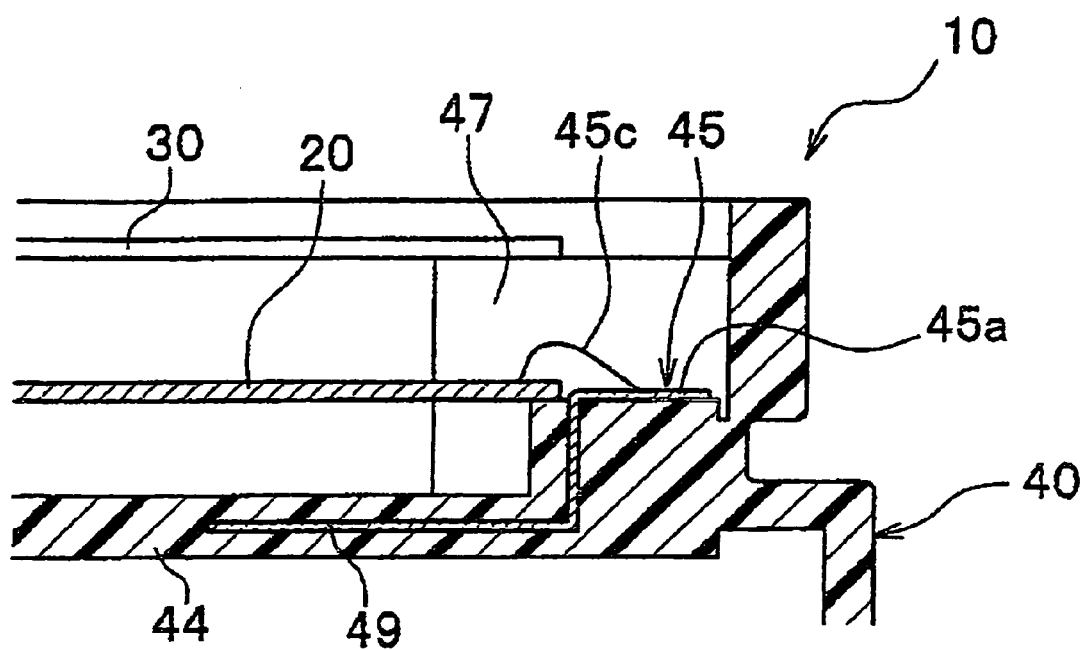
FIG. 6B is a sectional view showing a connection state between the conductive member and a first terminal collection portion when taken along the line A-A of FIG. 5A in the state in which a conductive member is disposed in the housing.

As shown in FIG. 6A, conductive members 49 extending from the terminals 48a of the second terminal collection portion 48 are connected to the predetermined terminals 45a of the first terminal collection portion 45 via the inside of the circuit board support stepped portion 47 and the partition portion 44 as shown in FIG. 6B. In this way, the terminals 48a of the second terminal collection portion 48 are electrically connected to the terminals 45a of the first terminal collection portion 45.

(Configuration of Cover)

As shown in FIG. 1, the cover 50 is a cover which is made from synthetic resin and closes an opening on the front side of the housing 40, and is fixed to an end surface on the front surface side of the housing 40 by welding or bonding.

(Configuration of Control Substrate)

Figure 4A:
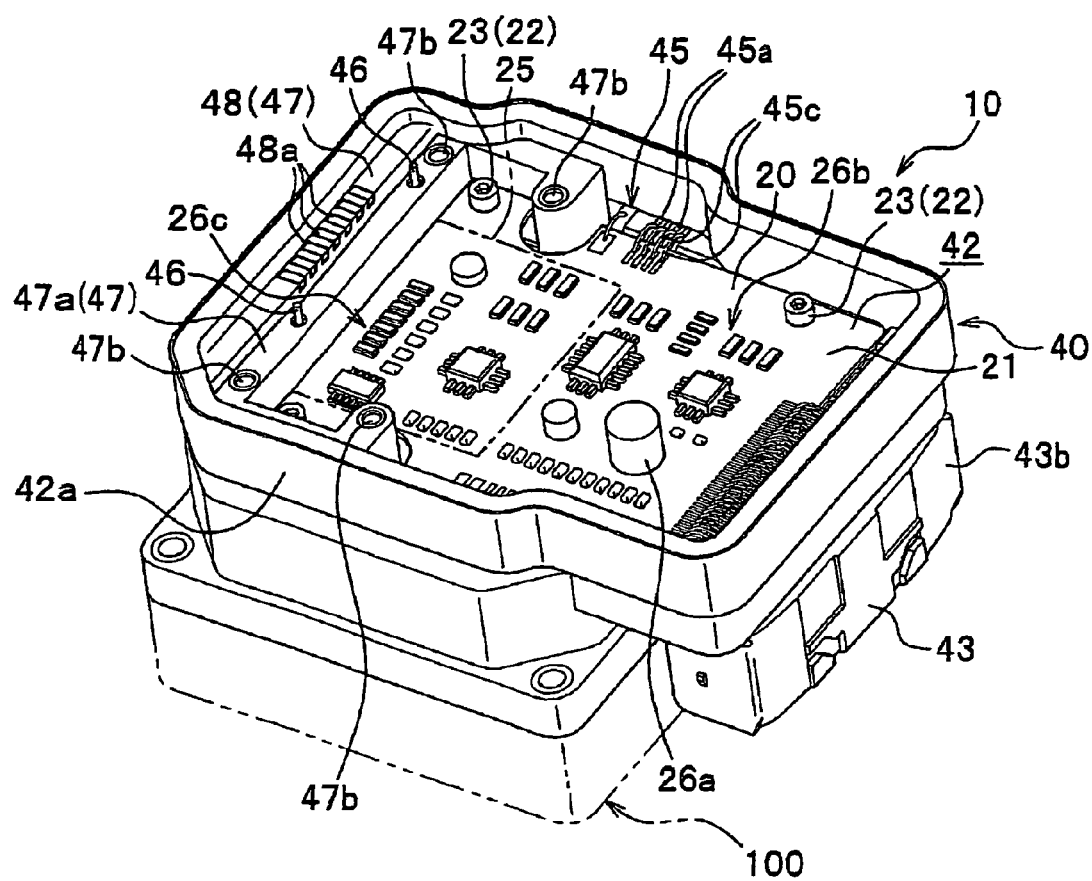
FIG. 4A is a perspective view when viewed from the front side of the housing in a state in which the control circuit board is mounted to the housing.
Figure 4B:
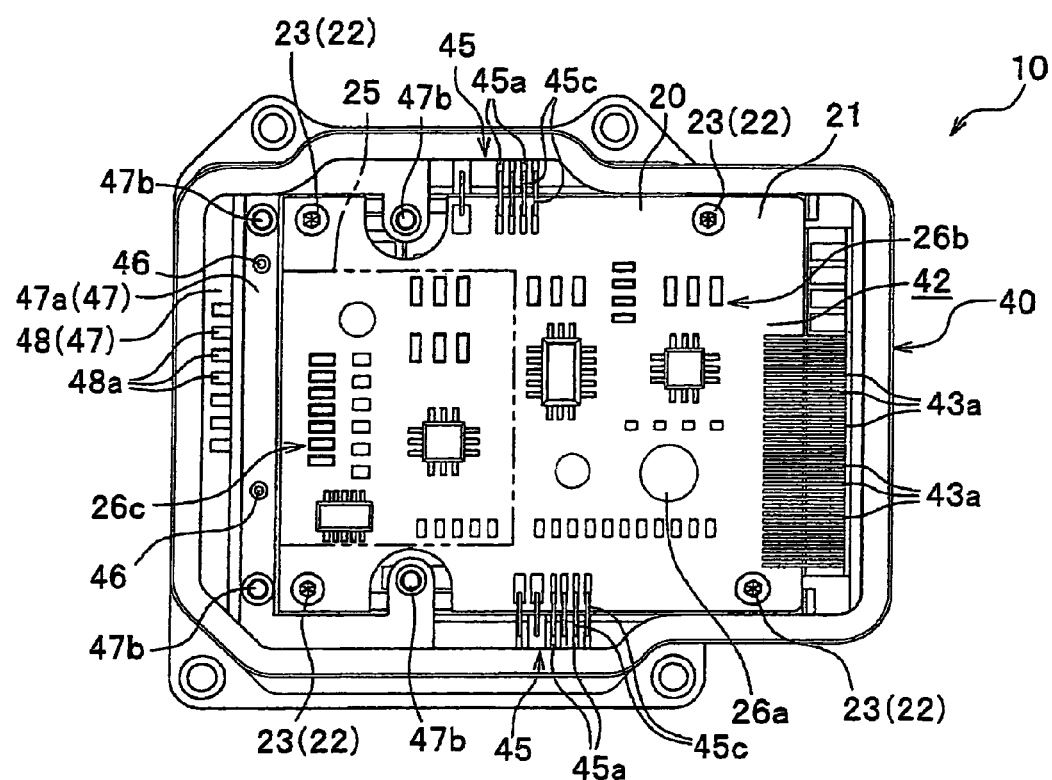
FIG. 4B is a top view when viewed from the front side of the housing in the state in which the control circuit board is mounted to the housing.

As shown in FIGS. 4A and 4B, the control circuit board 20 is configured such that electronic components (e.g., electric components) 26a, 26b, and 26c such as semiconductor chips are mounted to a circuit board body 21 on which an electronic circuit (conductive member) is printed. When the circuit board body 21 is mounted to a surface of the partition portion 44 of the housing 40 on the side of the second accommodation chamber 42, the control circuit board 20 is fixed to the inside of the second accommodation chamber 42 (see FIG. 2).

The control circuit board 20 is configured to control an operation of the motor 200 or an opening/closing operation of the electromagnetic valve V on the basis of program stored in advance or information obtained by various sensors such as the pressure sensor S or the sensor circuit board 30 shown in FIG. 2.

As shown in FIG. 4B, in the control circuit board 20, an insertion hole 22 is formed at positions in the vicinity of four corners of the circuit board body 21. When the control circuit board 20 is mounted to a surface of the partition portion 44 (see FIG. 3B) on the side of the second accommodation chamber 42, the insertion hole 22 communicates with the mounting hole 44b of each circuit board support portion 44a. Then, when the front end portion of a fixed bolt 23 inserted through the insertion hole 22 from the front side of the control circuit board 20 is screw-connected to the inside of the mounting hole 44b of each circuit board support portion 44a, the control circuit board 20 is mounted to a surface of the partition portion 44 on the side of the second accommodation chamber 42 in a parallel state.

A layered portion 25 is set in the front surface of the control circuit board 20 so as to mount the sensor circuit board 30 thereto in a layered state. The layered portion has a space between the control circuit board and the sensor circuit board, and upper surfaces both of the circuit board and the sensor circuit board are mounted to electric component.

In this embodiment, the tallest electronic component 26a and an electronic component 26b having a similar height to that of the electronic components 26a among various electronic components mounted to the front surface of the control circuit board 20 are mounted to a portion other than the layered portion 25, and comparatively short electronic component 26c is disposed in the layered portion 25.

In the control circuit board 20 mounted to the surface of the partition portion 44 (see FIG. 3B) on the side of the second accommodation chamber 42, the electronic components of the control circuit board 20 are electrically connected to the predetermined terminals 45a of the first terminal collection portion 45 via bonding wires 45c.

Accordingly, various electronic components mounted to the control circuit board 20 are electrically connected to the electric component mounted to the base body 100 (see FIG. 2).

(Configuration of Sensor Substrate)

As shown in FIG. 5A, the sensor circuit board 30 is configured such that electronic components such as an angular speed sensor 33 or an acceleration sensor 34 are mounted to a rectangular circuit board body 31 on which an electronic circuit (conductive member) is printed so as to detect a behavior of a vehicle body (a predetermined quantity) in terms of the angular speed sensor 33 and the acceleration sensor 34.

When the circuit board body 31 of the sensor circuit board 30 is mounted to the protruding end surfaces of the support portion 47a of the circuit board support stepped portion 47 (see FIG. 4B) formed in the surface of the partition portion 44 on the side of the second accommodation chamber 42 so as to be parallel to the front side (an upper side of FIG. 5A) of the layered portion 25 (see FIG. 4B) set in the front surface of the control circuit board 20, the sensor circuit board 30 and the control circuit board 20 are in a layered state.

As shown in FIG. 5B, since each of insertion holes 32a is formed at four corners of the circuit board body 31, the insertion hole 32a communicates with each mounting hole 47b (see FIG. 4B) of the support portion 47a when the circuit board 30 is mounted to the protruding end surface of the support portion 47a of the circuit board support stepped portion 47. Then, when the front end portion of a fixed bolt 32b inserted through the insertion hole 32a from the front side of the sensor circuit board 30 is screw-connected to the inside of each mounting hole 47b of the support portion 47a, the sensor circuit board 30 is mounted to the circuit board support stepped portion 47.

Positioning holes 35, 35 are formed in the sensor circuit board 30 so that the reference pins 46, 46 protruding from the circuit board support stepped portion 47 (see FIG. 4B) are inserted therethrough. Accordingly, at the time the circuit board 30 is mounted to the circuit board support stepped portion 47, it is possible to position the sensor circuit board 30 to the inside of the second accommodation chamber 42 of the housing 40 by allowing the reference pins 46, 46 to be inserted through the positioning holes 35, 35. Then, when the sensor circuit board 30 is positioned to the inside of the second accommodation chamber 42, a detection shaft of the angular speed sensor 33 and the acceleration sensor 34 is identical with a reference shaft indicating front, rear, left, and right directions of the vehicle.

In the sensor circuit board 30 mounted to the protruding end surface of the circuit board support stepped portion 47, the electronic circuit of the sensor circuit board 30 is electrically connected to the respective terminals 48a of the second terminal collection portion 48 of the circuit board support stepped portion 47 by the bonding wires 48b.

Then, as shown in FIGS. 6A and 6B, the terminals 48a of the second terminal collection portion 48 are connected to the terminals 45a of the first terminal collection portion 45 via the conductive members 49 embedded in the housing 40, and the terminals 45a are connected to the electronic circuit of the control circuit board 20 via the bonding wires 45c.

In this way, since the electronic circuit of the sensor circuit board 30 is electrically connected to the electronic circuit of the control circuit board 20 via the conductive members 49 embedded in the second terminal collection portion 48 of the housing 40, it is possible to output information on the behavior of the vehicle detected by the angular speed sensor 33 and the acceleration sensor 34 mounted to the sensor circuit board 30 to the control circuit board 20.

[Effect and Advantage of Electronic Control Unit and Vehicle Behavior Control Device]

In the electronic control unit 10 according to this embodiment, as shown in FIG. 5A, since the control circuit board 20 and the sensor circuit board 30 are accommodated in the housing 40 in a layered state, and the angular speed sensor 33 and the acceleration sensor 34 are not necessary to be mounted to the surface of the control circuit board 20, it is not necessary to allow the control circuit board 20 to have a large area.

Since the sensor circuit board 30 and the control circuit board 20 are separated from each other, and only the sensor circuit board 30 is a process target upon carrying out an examination/adjustment operation of the angular speed sensor 33 and the acceleration sensor 34, it is possible to improve process efficiency of the examination/adjustment operation.

Since only the configuration of the sensor circuit board 30 is changed without changing the configuration of the control circuit board 20 upon changing the specification of the angular speed sensor 33 and the acceleration sensor 34, it is possible to reduce a cost and an operation time spent for the specification change of the angular speed sensor 33 and the acceleration sensor 34.

As shown in FIG. 6A, when the sensor circuit board 30 is mounted to the circuit board support stepped portion 47 formed in the inner surface of the housing 40, the sensor circuit board 30 and the control circuit board 20 are arranged in a layered state, and the sensor circuit board 30 is electrically connected to the control circuit board 20 by the conductive members 49 embedded in the housing 40 (see FIG. 6B). For this reason, since it is not necessary to provide a component such as a harness for connecting the sensor circuit board 30 to the control circuit board 20 in an inner space of the housing 40, it is possible to efficiently use the inner space of the housing 40.

Since it is possible to electrically connect the sensor circuit board 30 to the control circuit board 20 in such a manner that the terminals 48a of the conductive members 49 exposed on the protruding end surface of the circuit board support stepped portion 47 are connected to the sensor circuit board 30 mounted to the circuit board support stepped portion 47 by the bonding wires 48b, it is possible to improve assembling efficiency of the sensor circuit board 30 and the control circuit board 20.

As shown in FIG. 5B, when the reference pins 46, 46 formed in the circuit board support stepped portion 47 are inserted through (engaged with) the positioning holes 35, 35 of the sensor circuit board 30, the sensor circuit board 30 is positioned to the inside of the second accommodation chamber 42 of the housing 40. Accordingly, since the detection shaft of the angular speed sensor 33 and the acceleration sensor 34 is simply identical with the reference shaft set in the front, rear, left, and right directions, it is possible to improve assembling efficiency of the sensor circuit board 30 and the control circuit board 20.

As shown in FIG. 4A, since a gap between the control circuit board 20 and the sensor circuit board 30 becomes narrow in such a manner that the tallest electronic component 26a among the plurality of electronic components mounted to the front surface of the control circuit board 20 and the electronic component 26b having a similar height to that of the electronic component 26a are mounted to a portion other than the layered portion 25, and the comparatively short electronic component 26c is mounted to the layered portion 25, it is possible to more realize a decrease in size of the electronic control unit 10.

In the vehicle behavior control device U shown in FIG. 1 using the above-described electronic control unit 10, since the angular speed sensor 33 and the acceleration sensor 34 (see FIG. 5B) are provided in the electronic control unit 10, it is possible to simply carry out an assembling operation without a harness upon assembling the vehicle behavior control device to the vehicle.

Since it is not necessary to allow the control circuit board 20 (see FIG. 5B) to have a large area, it is possible to prevent an unnecessary increase in size of the vehicle behavior control device U.

Another Embodiment

While the preferred embodiment has been described, the invention is not limited thereto, but may be appropriately modified within a scope without departing from the spirit of the invention.

Figure 7A:
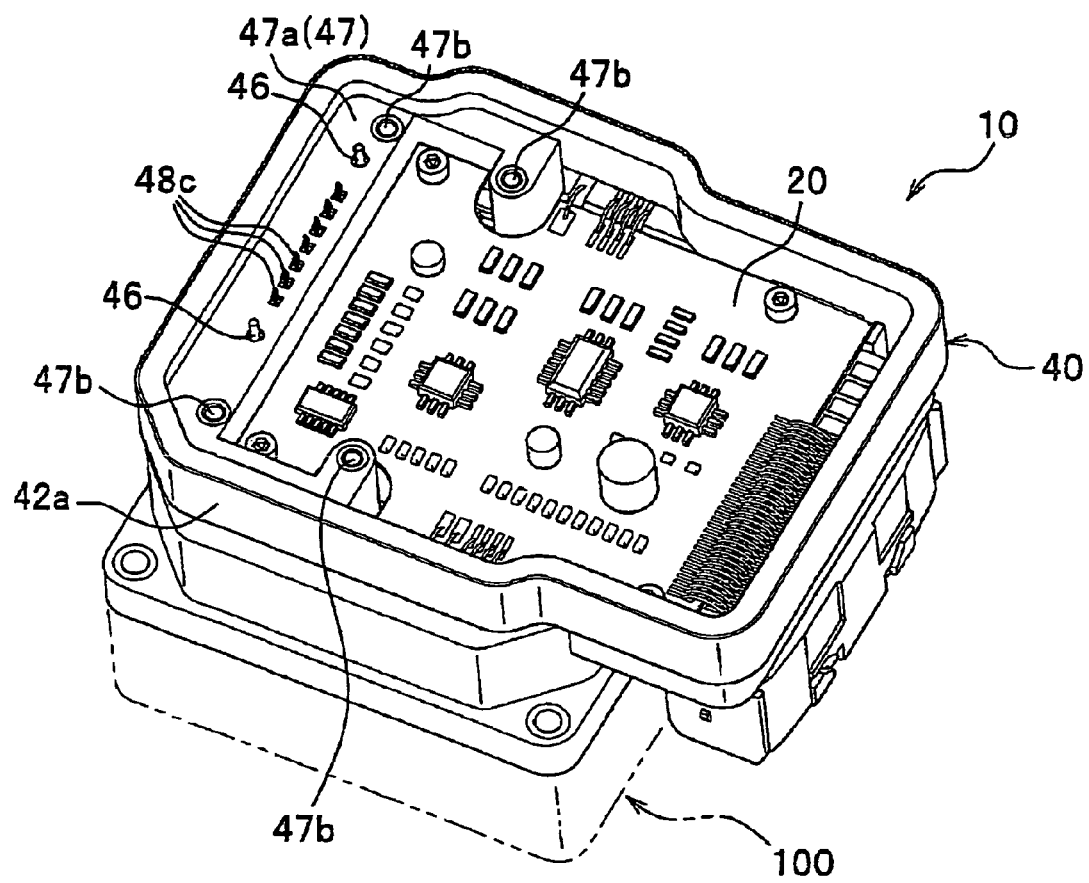
FIG. 7A is a view showing the control circuit board mounted to the housing when viewed from a front side according to another embodiment.
Figure 7B:
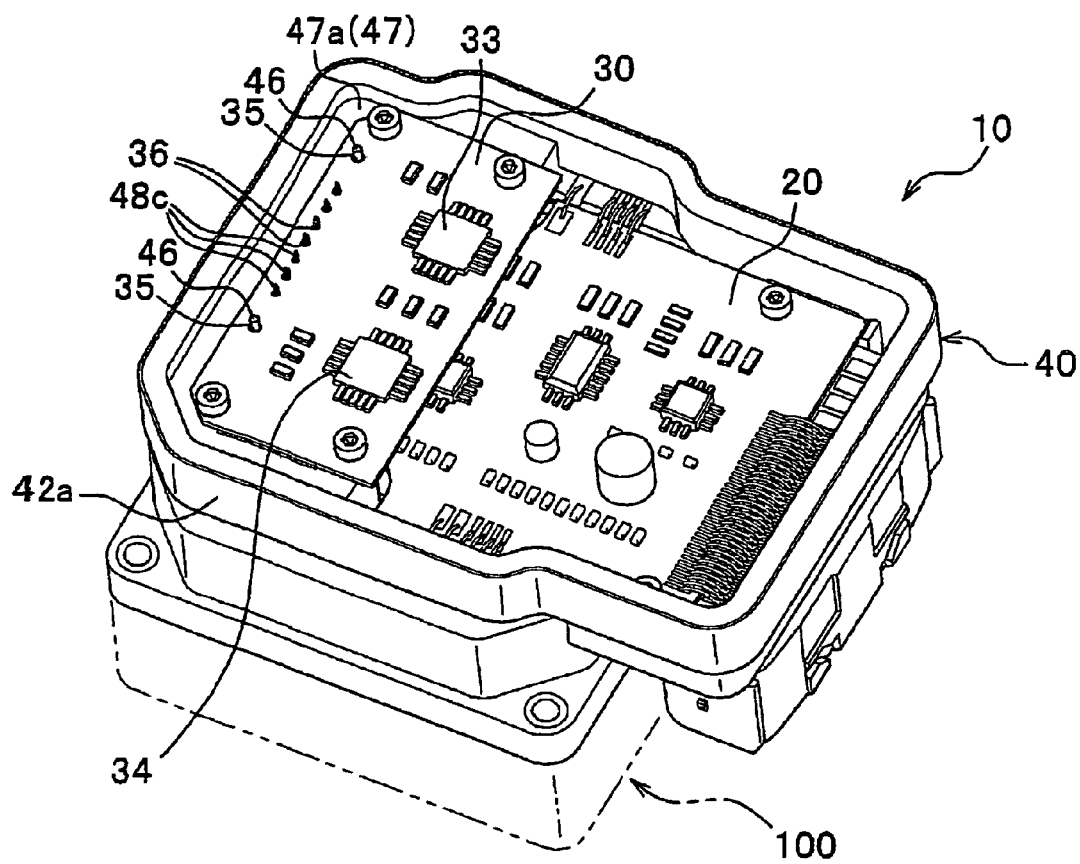
FIG. 7B is a view showing the sensor circuit board and the control circuit board mounted to the housing when viewed from a front side according to another embodiment.

For example, in this embodiment, as shown in FIG. 5B, although the electronic circuit of the sensor circuit board 30 is electrically connected to the terminals 48a of the second terminal collection portion 48 by the bonding wires 48b, as shown in FIGS. 7A and 7B, a plurality of press-fitting terminals 48c protruding from the protruding end surface of the support portion 47a of the circuit board support stepped portion 47 may be connected to the electronic circuit of the sensor circuit board 30.

Figure 8:
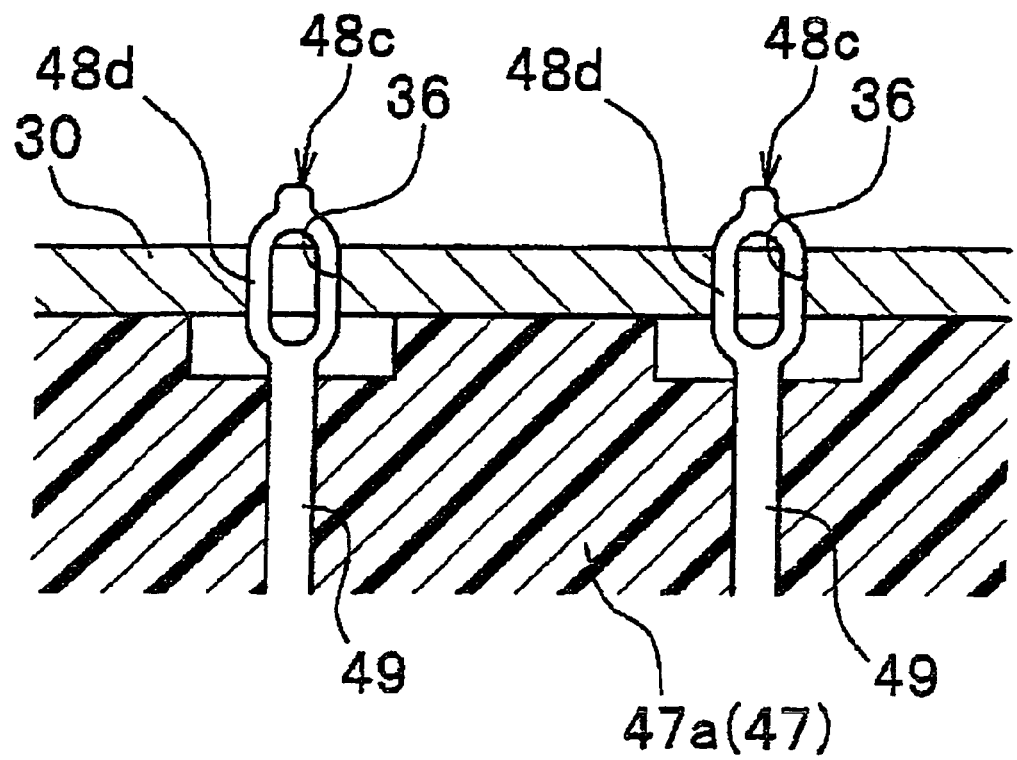
FIG. 8 is a sectional view showing a press-fitting terminal used in the electronic control unit according to another embodiment.

As shown in FIG. 8, each of the press-fitting terminals 48c is a metallic conductive component and has an annular width-expansion press-fitting portion 48d formed in the front end portion. Then, when the press-fitting portion 48d of the press-fitting terminal 48c is press-fitted to a connection hole 36 formed in the sensor circuit board 30 upon mounting the sensor circuit board 30 to the protruding end surface of the support portion 47a of the circuit board support stepped portion 47, the electronic circuit of the control circuit board 20 can be electrically connected to the electronic circuit of the sensor circuit board 30 (see FIG. 7B).

In this way, in the configuration using the press-fitting terminal 48c, since the sensor circuit board 30 can be electrically connected to the control circuit board 20 in such a manner that the press-fitting terminal 48c formed in the protruding end surface of the support portion 47a of the circuit board support stepped portion 47 is press-fitted to the connection hole 36 of the sensor circuit board 30 mounted to the circuit board support stepped portion 47, it is possible to improve assembling efficiency of the sensor circuit board 30 and the control circuit board 20.

In this embodiment, as shown in FIG. 5A, although the sensor circuit board 30 is disposed on the front side (an upper side of FIG. 5A) of the control circuit board 20 by mounting the sensor circuit board 30 to the circuit board support stepped portion 47 formed in the inner surface of the housing 40, the control circuit board 20 may be disposed on the front side of the sensor circuit board 30 in such a manner that the sensor circuit board 30 is mounted to the partition portion 44 (see FIG. 3B) and the control circuit board 20 is mounted to the circuit board support stepped portion 47.

When a semiconductor chip for processing signals from the angular speed sensor 33 and the acceleration sensor 34 is mounted to the layered portion 25 set in the front surface of the control circuit board 20 shown in FIG. 4B, wires between the semiconductor chip and the angular speed sensor 33 and the acceleration sensor 34 become short, and thus an influence caused by electric noise does not occur upon processing the signals from the angular speed sensor 33 and the acceleration sensor 34. Accordingly, it is possible to detect information on the behavior of the vehicle with high precision.

The electronic components may be mounted to the rear surface of the sensor circuit board 30 shown in FIG. 2 opposed to the control circuit board 20. Since it is possible to suppress a gap between the control circuit board 20 and the sensor circuit board 30 even when the rear surface of the sensor circuit board 30 is opposed to the layered portion 25 mounted with the comparatively short electronic component 26c (see FIG. 4B) and the electronic components are mounted to the rear surface of the sensor circuit board 30, it is possible to efficiently use the inner space of the housing 40. In addition, since the number of components mounted to one surface of the sensor circuit board 30 decreases, it is possible to reduce an area of the sensor circuit board 30, and thus to realize a decrease in size of the sensor circuit board 30.

What is claimed is:

1. An electronic control unit comprising:
a sensor circuit board which is mounted with a sensor for detecting a physical quantity;
a control circuit board which controls an operation of an electromagnetic component on a basis of the detected physical quantity; and
a housing which accommodates the sensor circuit board and the control circuit board,
wherein the sensor circuit board is mounted to a stepped portion formed in an inner surface of the housing so that the sensor circuit board and the control circuit board are arranged in a layered state, and the control circuit board is mounted to a different portion of the housing such that a portion of the control circuit board is surrounded by the stepped portion, and
the sensor circuit board is electrically connected to the control circuit board by a conductive member embedded in the housing.

2. The electronic control unit according to claim 1, wherein the conductive member includes a connection terminal exposed on a surface of the stepped portion, and
the sensor circuit board is electrically connected to the connection terminal by a bonding wire.

3. The electronic control unit according to claim 1, wherein the conductive member comprises a press-fitting terminal exposed on a surface of the stepped portion, and
the press-fitting terminal is press-fitted to a connection hole formed in the sensor circuit board so that the sensor circuit board is electrically connected to the press-fitting terminal.

4. The electronic control unit according to claim 1, wherein an engagement portion is formed in the inner surface of the housing to insert the sensor circuit board.

5. The electronic control unit according to claim 1, wherein a layered portion is formed on a surface of the control circuit board so as to layer the sensor circuit board above the control circuit board,
and a tallest electronic component among a plurality of the electronic components mounted to the surface of the control circuit board is mounted to a portion other than the layered portion.

6. The electronic control unit according to claim 5, wherein the layered portion has a space between the control circuit board and the sensor circuit board, and the plurality of electronic components are mounted at a space between the control circuit board and the sensor circuit board.

7. The electronic control unit according to claim 1, wherein the sensor comprises an angular speed sensor and an acceleration sensor.

8. A vehicle behavior control device using the electronic control unit according to claim 1, comprising:
a base body; and
the electromagnetic component which is provided in the base body,
wherein the electronic control unit controls an operation of the electromagnetic component on the basis of the behavior of a vehicle body detected by the sensor so as to control a brake hydraulic pressure in a brake hydraulic passage.

9. The electronic control unit according to claim 8, wherein the conductive member includes a connection terminal exposed on a surface of the stepped portion, and
the sensor circuit board is electrically connected to the connection terminal by a bonding wire.

10. The electronic control unit according to claim 1, wherein the conductive member includes a press-fitting terminal exposed on a surface of the stepped portion, and the press-fitting terminal is press-fitted to a connection hole formed in the control circuit board so that the control circuit board is electrically connected to the press-fitting terminal.

11. The electronic control unit according to claim 1, wherein the sensor circuit board and the control circuit board only partially overlap with one another.

12. The electronic control unit according to claim 11, wherein a portion of the sensor circuit board extends beyond the control circuit board, and a portion of the control circuit board mounted to the stepped portion extends beyond the sensor circuit board.

13. The electronic control unit according to claim 1, wherein the housing comprises an upward extending periphery wall, the upward extending periphery wall surrounding both the sensor circuit board and the control circuit board.

14. The electronic control unit according to claim 13, wherein an outer peripheral shape of the upward extending periphery wall is substantially formed into a rectangular shape with an outward swollen part formed in two elongate sides.

15. The electronic control unit according to claim 14, further comprising a first terminal collection portion formed on an inner side of the swollen part.

16. The electronic control unit according to claim 1, further comprising reference pins protruding from the stepped portion between mounting holes, wherein positioning holes are formed in the sensor circuit board so that the reference pins protruding from the stepped portion are insertable therethrough.

17. The electronic control unit according to claim 16, wherein the sensor circuit board is positioned such that a detection shaft of an angular speed sensor and acceleration sensor is identical with a reference shaft indicating front, rear, left, and right directions of a vehicle.

18. The electronic control unit according to claim 1, wherein the conductive member is terminals positioned on an inner wall of a periphery wall surrounding both the sensor circuit board and the control circuit board, wherein an electronic circuit of the sensor circuit board is electrically connected to the terminals by bonding wires.

19. The electronic control unit according to claim 1, further comprising control circuit board support portions, positioned below a surface of the stepped portion and within an area defined by the stepped portion, and structured to attach the control circuit board to the housing.

20. An electronic control unit comprising:
a sensor circuit board which is mounted with a sensor for detecting a physical quantity;
a control circuit board which controls an operation of an electric component on a basis of the detected physical quantity; and
a housing which accommodates the sensor circuit board and the control circuit board,
wherein the sensor circuit board is mounted to a stepped portion formed in an inner surface of the housing so that the sensor circuit board and the control circuit board are arranged in a layered state and both of which are surrounded by a single upward extending periphery wall; and
the sensor circuit board is electrically connected to the control circuit board by a conductive member embedded in the housing.

* * * * *